(12) United States Patent
Lu

(10) Patent No.: US 10,658,280 B2
(45) Date of Patent: May 19, 2020

(54) ELECTRICAL DEVICE INCLUDING A THROUGH-SILICON VIA STRUCTURE

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/858,723

(22) Filed: Dec. 29, 2017

(65) Prior Publication Data

US 2019/0206778 A1    Jul. 4, 2019

(51) Int. Cl.
| | | |
|---|---|---|
| *H01L 23/498* | (2006.01) | |
| *H01L 25/065* | (2006.01) | |
| *H01L 27/12* | (2006.01) | |
| *H01L 21/768* | (2006.01) | |
| *H01L 23/48* | (2006.01) | |
| *H01L 21/48* | (2006.01) | |
| *H01L 23/373* | (2006.01) | |

(52) U.S. Cl.
CPC ...... *H01L 23/49827* (2013.01); *H01L 21/481* (2013.01); *H01L 21/486* (2013.01); *H01L 21/76898* (2013.01); *H01L 23/481* (2013.01); *H01L 23/49877* (2013.01); *H01L 25/0657* (2013.01); *H01L 27/12* (2013.01); *H01L 23/373* (2013.01); *H01L 23/3738* (2013.01); *H01L 23/49816* (2013.01); *H01L 2225/06544* (2013.01)

(58) Field of Classification Search
CPC .......... H01L 23/49827; H01L 23/3738; H01L 21/486; H01L 23/481; H01L 21/76898; H01L 21/481; H01L 23/49877; H01L 27/12; H01L 25/0657; H01L 23/49816; H01L 2225/06544
USPC ......................................................... 257/621
See application file for complete search history.

(56) References Cited

U.S. PATENT DOCUMENTS

| | | | | |
|---|---|---|---|---|
| 8,916,973 | B1* | 12/2014 | Kim ...................... | H01L 23/345 257/750 |
| 2005/0110168 | A1* | 5/2005 | Chuang ................... | H01L 23/06 257/788 |
| 2011/0006425 | A1* | 1/2011 | Wada ................ | H01L 21/76807 257/750 |
| 2011/0095435 | A1* | 4/2011 | Volant ............... | H01L 21/76898 257/774 |
| 2012/0006580 | A1* | 1/2012 | Sandhu ............. | H01L 23/53238 174/126.1 |

(Continued)

*Primary Examiner* — Mohammad M Hoque
(74) *Attorney, Agent, or Firm* — Foley & Lardner

(57) ABSTRACT

An electrical device includes a substrate and a via. The substrate has a first surface and defines a recess in the first surface. The via is disposed in the recess. The via includes an insulation layer, a first conductive layer and a second conductive layer. The insulation layer is disposed on the first surface of the substrate and extends at least to a sidewall of the recess. The first conductive layer is disposed adjacent to the insulation layer and extends over at least a portion of the first surface. The second conductive layer is disposed adjacent to the first conductive layer and extends over at least a portion of the first surface. The second conductive layer has a negative coefficient of thermal expansion (CTE).

21 Claims, 13 Drawing Sheets

(56) References Cited

U.S. PATENT DOCUMENTS

| | | | |
|---|---|---|---|
| 2012/0086132 A1* | 4/2012 | Kim | B82Y 30/00 257/774 |
| 2013/0320538 A1* | 12/2013 | Jindal | H01L 21/76898 257/751 |
| 2014/0015136 A1* | 1/2014 | Gan | H01L 23/52 257/751 |
| 2014/0117548 A1* | 5/2014 | Katagiri | H01L 23/53276 257/751 |
| 2014/0117559 A1* | 5/2014 | Zimmerman | H01L 23/481 257/774 |
| 2015/0035150 A1* | 2/2015 | Li | H01L 23/481 257/747 |
| 2016/0225694 A1* | 8/2016 | Barth | H01L 23/481 |

* cited by examiner

ELECTRICAL DEVICE INCLUDING A THROUGH-SILICON VIA STRUCTURE

BACKGROUND

1. Technical Field

The present disclosure relates to an electrical device and a method of manufacturing the same.

2. Description of the Related Art

A semiconductor device package may include a semiconductor device having a substrate (e.g. a silicon substrate). The silicon substrate may include a through-silicon via (TSV) structure. The TSV structure may include a conductive structure surrounded by a passivation layer. Delamination may occur at or close to a boundary between the conductive structure and the passivation layer due to coefficient of thermal expansion (CTE) mismatch. Delamination issues can adversely affect reliability of the semiconductor device package.

SUMMARY

In one or more embodiments, an electrical device includes a substrate and a via. The substrate has a first surface and defines a recess in the first surface. The via is disposed in the recess. The via includes an insulation layer, a first conductive layer and a second conductive layer. The insulation layer is disposed on the first surface of the substrate and extends at least to a sidewall defining the recess. The first conductive layer is disposed adjacent to the insulation layer and extends over at least a portion of the first surface. The second conductive layer is disposed adjacent to the first conductive layer and extends over at least a portion of the first surface. The second conductive layer has a negative CTE.

In one or more embodiments, an electrical device includes a substrate and a via. The substrate has a first surface that defines at least a portion of a recess, and a second surface opposite to the first surface. The via is disposed in the recess. The via includes a first insulation layer disposed adjacent to a sidewall of the recess; a first conductive layer disposed adjacent to the insulation layer, wherein a CTE of the first conductive layer is positive; a second conductive layer disposed on the first conductive layer, and wherein a CTE of the second conductive layer is negative, a second insulation layer disposed on the second conductive layer, wherein a CTE of the second insulation layer is positive and wherein the second conductive layer surrounds the second insulation layer.

In one or more embodiments, an electrical device includes a substrate, an active circuit layer and a via. The substrate includes a first surface defining at least a portion of a recess, and a second surface opposite to the first surface. The active circuit layer is disposed on the second surface. The via is disposed in the recess. The via includes an insulation ring disposed one the first surface and adjacent to a sidewall defining the recess; a first conductive cup in the insulation ring; a second conductive cup in the first conductive cup, and wherein a CTE of the second conductive cup is negative, an insulation layer disposed in the second conductive cup.

In one or more embodiments, an electrical device includes a substrate, a via and a patterned conductive layer. The substrate has a first surface and defines a through hole. The via is disposed in the through hole and includes one or more conductive portions. The patterned conductive layer has a negative CTE and is disposed on the first surface. The patterned conductive layer is electrically insulated from the conductive portions of the via.

BRIEF DESCRIPTION OF THE DRAWINGS

Common reference numerals are used throughout the drawings and the detailed description to indicate the same or similar elements. Embodiments of the present disclosure will be readily apparent from the following detailed description taken in conjunction with the accompanying drawings.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such arrangement.

Figure 1:
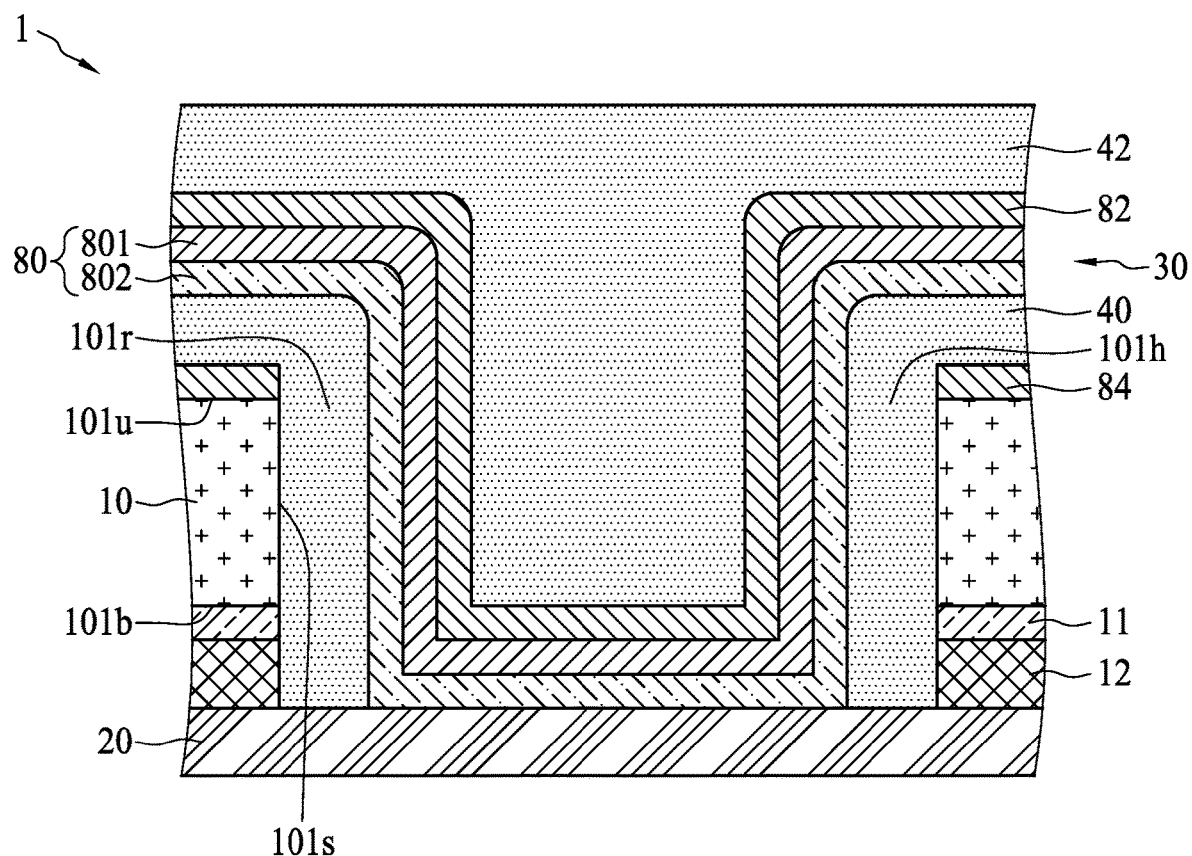
FIG. 1 is a cross-sectional view of an electrical device in accordance with some embodiments of the present disclosure.

FIG. 1 is a cross-sectional view of an electrical device 1 in accordance with some embodiments of the present disclosure. The electrical device 1 includes a substrate 10, a stress adjusting layer 84, a dielectric layer 11, a conductive layer 12, an active circuit layer 20 and a via 30.

The substrate 10 has a surface 101u (also referred to herein as a "first surface") and defines a recess 101r in the surface 101u. The substrate 10 has a surface 101b (also referred to herein as a "second surface") opposite to the surface 101u. The substrate 10 defines a through hole 101h (e.g. at least a portion of which is constituted by the recess 101r). The via 30 includes an insulation layer 40, an insulation layer 42, a conductive layer 80 and a conductive layer 82. The via 30 is disposed in the recess 101r. In some embodiments, the via 30 is disposed in the through hole 101h.

The insulation layer 40 is disposed on the surface 101u of the substrate 10 and extends at least to a sidewall 101s of the recess 101r. The insulation layer 40 is disposed adjacent to the sidewall 101s of the recess 101r. In one or more embodiments, the insulation layer 40 includes a ring portion (also referred to herein as an "insulation ring") having a ring shape. The insulation layer 40 is disposed on the surface 101u and is adjacent to the sidewall 101s of the recess 101r. The insulation ring may be disposed in the recess 101r. The conductive layer 80 may include a first cup portion (also referred to herein as a "first conductive cup") having a cup shape disposed in the ring portion of the insulation layer 40. The conductive layer 82 may include a second cup portion (also referred to herein as a "second conductive cup") having a cup shape disposed in the first cup portion of the conductive layer 80. The CTE of the second cup portion of the conductive layer 82 is less than 0 (is negative, namely contracts upon heating). The insulation layer 42 is disposed in the second cup portion of the conductive layer 82. The CTE of the insulation layer 42 is greater than 0 (is positive, namely expands upon heating). The CTE of the conductive layer 80 is greater than 0 (is positive). In one or more embodiments, the stress adjusting layer 84 is electrically insulated from conductive portions of the via 30 (e.g. from the first conductive layer 80 and the second conductive layer 82). In one or more embodiments, the stress adjusting layer 84 is a patterned conductive layer.

The conductive layer 80 is disposed adjacent to the insulation layer 40 and extends over at least a portion of the surface 101u. A conductive layer 82 is disposed adjacent to the conductive layer 80 and is extends over at least a portion of the surface 101u.

The stress adjusting layer 84 is disposed on the first surface 101u. The stress adjusting layer 84 has a negative CTE. The conductive layer 82 is disposed on the conductive layer 80. In some embodiments, a thickness of one of the stress adjusting layer 84 and conductive layer 82, each of the stress adjusting layer 84 and conductive layer 82, or both of the stress adjusting layer 84 and conductive layer 82 may range from about 1 nanometer (nm) to about 5 nm. Stress caused by thermal expansion of the insulation layer 40 during a heating operation may cause warpage of the electrical device 1. Contraction of the conductive layer 82 may constrain or at least partially cancel out the stress caused by the thermal expansion of the insulation layer 40 during the heating operation. The contraction of the conductive layer 82 may help to avoid the warpage of the electrical device 1.

In one or more embodiments, a material of the conductive layer 82 and the stress adjusting layer 84 may include, for example, graphene, or other suitable conductive materials having a negative CTE (e.g. a negative value with a magnitude at room temperature of at least about $1 \times 10^{-8}$ $K^{-1}$, at least about $1 \times 10^{-7}$ $K^{-1}$, or at least about $1 \times 10^{-6}$ $K^{-1}$). In one or more embodiments, the conductive layer 82 and the stress adjusting layer 84 are made from a same material. The active circuit layer 20 is disposed on the surface 101b. In one or more embodiments, the active circuit layer 20 may include a layer of a die/chip. The active circuit layer 20 is electrically connected to the conductive layer 80. The insulation layer 42 is disposed on the conductive layer 82. The conductive layer 82 surrounds the insulation layer 42. The stress adjusting layer 84 disposed on the surface 101u of substrate 10 may mitigate the warpage of the electrical device 1. The conductive layer 82 (which may include graphene) has a relatively high thermal conductivity which facilitates heat dissipation.

In some embodiments, the conductive layer 80 includes a layer 801 and a seed layer 802. In one or more embodiments, a material of the conductive layer 80 may include, for example, copper (Cu), another metal, an alloy, or other suitable conductive materials. In some embodiments, the substrate 10 includes silicon (Si), a glass, a ceramic, a metal (such as, for example, Cu, nickel (Ni), a silver (Ag) tin (Sn) alloy (Ag/Sn), palladium (Pd), or another suitable metal), a lead frame, polypropylene (PP), a polyimide (PI), an Ajinomoto Build-up Film (ABF), or other suitable insulating materials. In some embodiments, the substrate 10 includes a semiconductor material.

In one or more embodiments, a material of the conductive layer 12 may include, for example, aluminum (Al), another conductive metal or alloy, or other suitable conductive materials. In one or more embodiments, a material of the insulation layers 40 and 42 may include, for example, a solder mask, PP, a PI, an ABF, an epoxy, a molding compound, a liquid type (or solid type) photosensitive material, a glass, a ceramic, or other suitable materials. In one or more embodiments, a material of the dielectric layer 11 may include, for example, an oxide layer, a nitride layer or other suitable conductive materials. A conductive layer 82 having a negative CTE (such as graphene) may compensate for a CTE mismatch between the components in the electrical device 1. The conductive layer 82 may mitigate the warpage of the semiconductor device package 1.

Figure 2A:
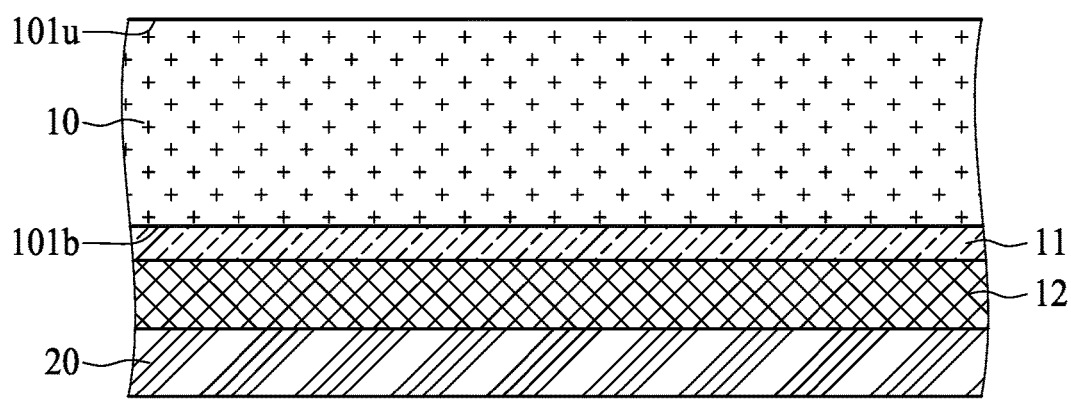
FIG. 2A, FIG. 2B, FIG. 2C, FIG. 2D, FIG. 2E, FIG. 2F, FIG. 2G, FIG. 2H, FIG. 2I, FIG. 2J, FIG. 2K and FIG. 2L illustrate some embodiments of a method of manufacturing the electrical device of FIG. 1.

FIG. 2A through FIG. 2L illustrate some embodiments of a method of manufacturing the electrical device 1 of FIG. 1. Referring to FIG. 2A, an active circuit layer 20 is provided. A conductive layer 12 is disposed on the active circuit layer 20. A dielectric layer 11 is disposed on the conductive layer 12. A substrate 10 is disposed on the dielectric layer 11. In one or more embodiments, the substrate 10 includes Si, a glass, a ceramic, a metal (such as, for example, Cu, Ni, Ag/Sn, Pd, or another suitable metal), a lead frame, PP, a PI, an ABF, or other suitable insulating materials. In one or more embodiments, a material of the dielectric layer 11 may include, for example, an oxide layer, a nitride layer or other suitable conductive materials. In one or more embodiments, a material of the conductive layer 12 may include, for example, Al, a conductive metal or alloy, or other suitable conductive materials. In one or more embodiments, the active circuit layer 20 may include a layer of a die/chip.

Figure 2B:
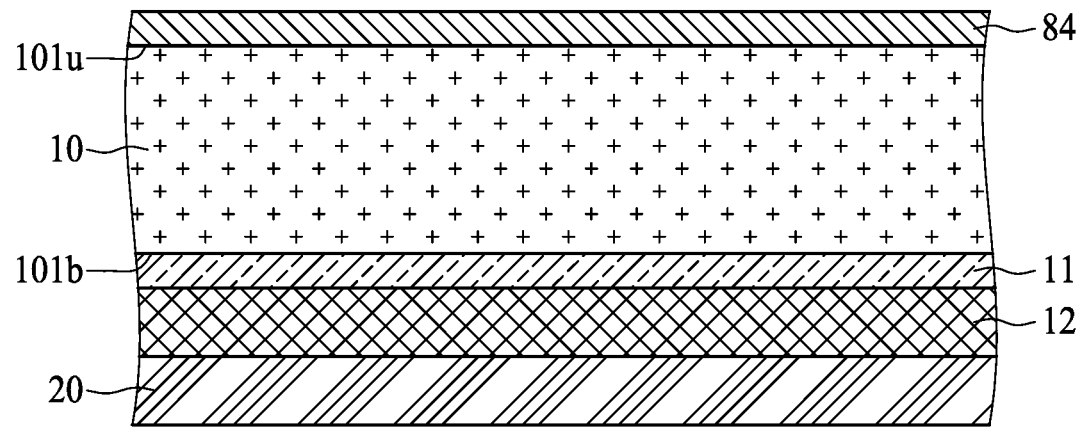

Referring to FIG. 2B, a stress adjusting layer 84 is disposed on the surface 101u of substrate 10. In one or more embodiments, a material of the stress adjusting layer 84 may include, for example, graphene, or other suitable conductive materials. The CTE of the stress adjusting layer 84 is less than 0 (is negative).

Figure 2C:
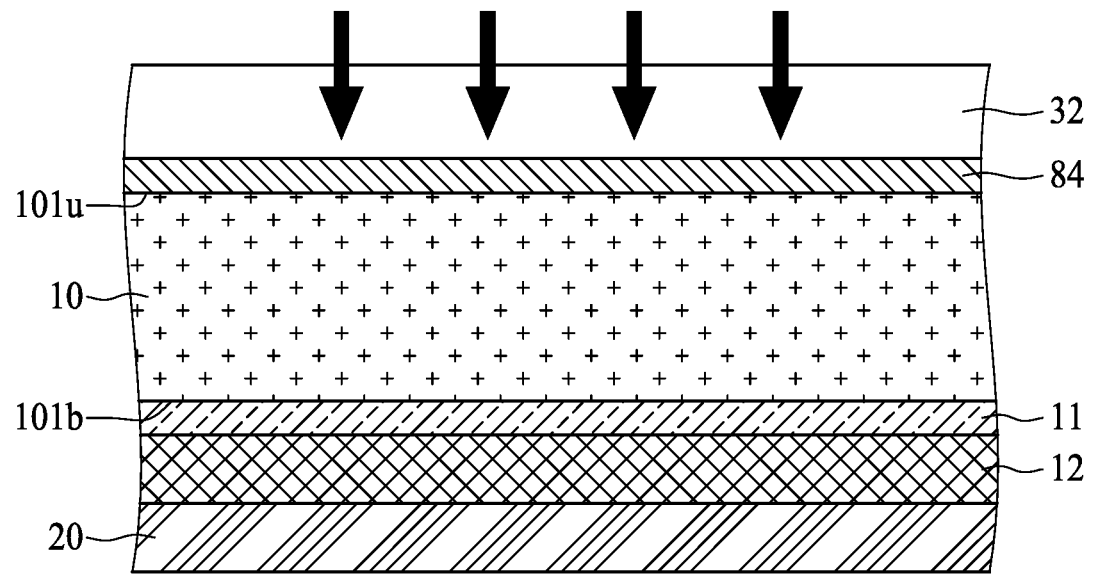

Referring to FIG. 2C, a photoresist layer 32 is disposed on the stress adjusting layer 84. In one or more embodiments, a material of the photoresist layer 32 may include, for example, a photosensitive material, a positive PI, a positive or negative photoresist or other suitable materials.

Figure 2D:
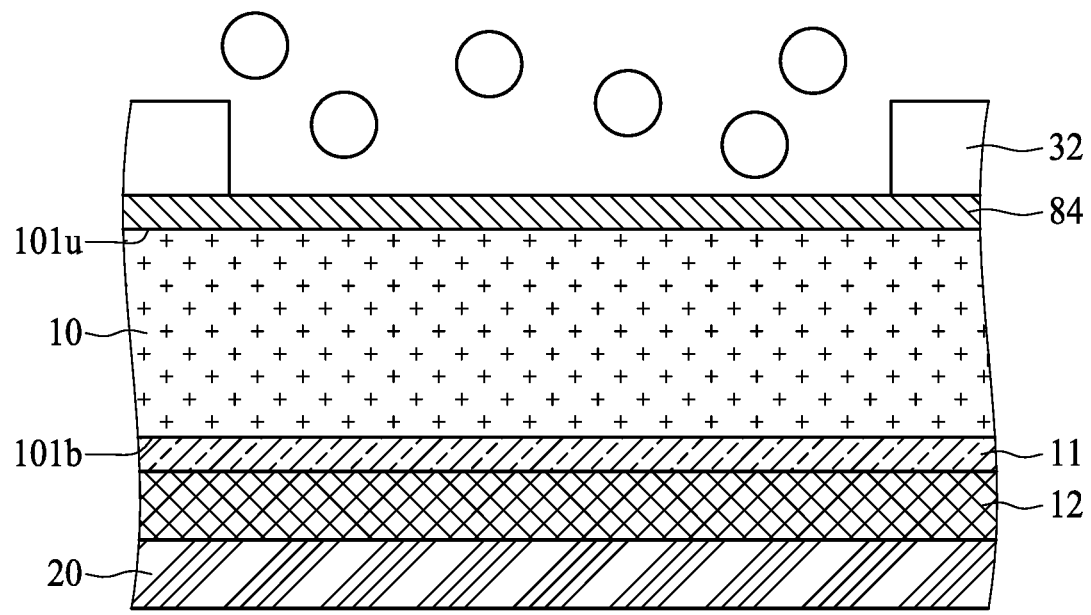

Referring to FIG. 2D, a portion of the photoresist layer 32 is etched by a suitable gas/chemistry process. After the etching operation, a portion of the surface of the stress adjusting layer 84 is exposed.

Figure 2E:
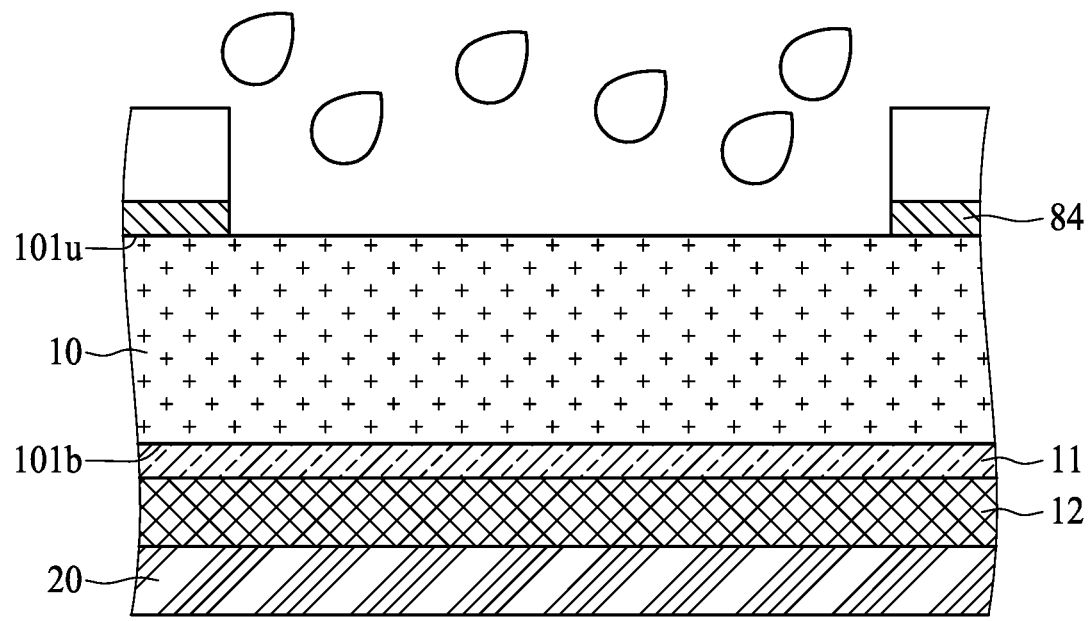

Referring to FIG. 2E, a portion of the stress adjusting layer 84 is etched by a suitable gas/chemistry process. After the etching operation, a portion of the surface of the substrate 10 is exposed.

Figure 2F:
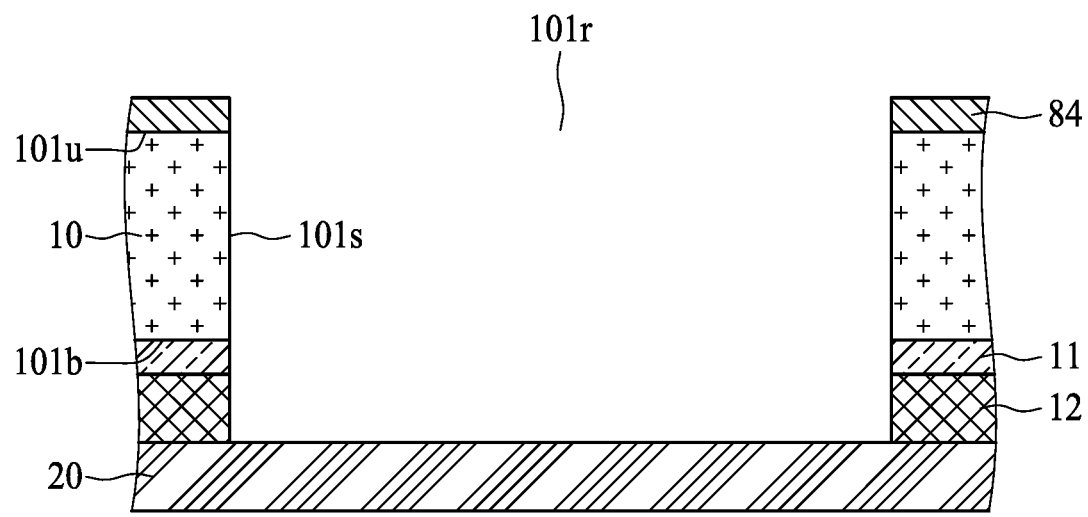

Referring to FIG. 2F, a portion of the dielectric layer 11, the conductive layer 12 and the substrate 10 is removed to form a TSV structure. After the removing operation, a portion of the surface of the active circuit layer 20 is exposed and a recess 101r (or a through hole 101h) is formed.

Figure 2G:
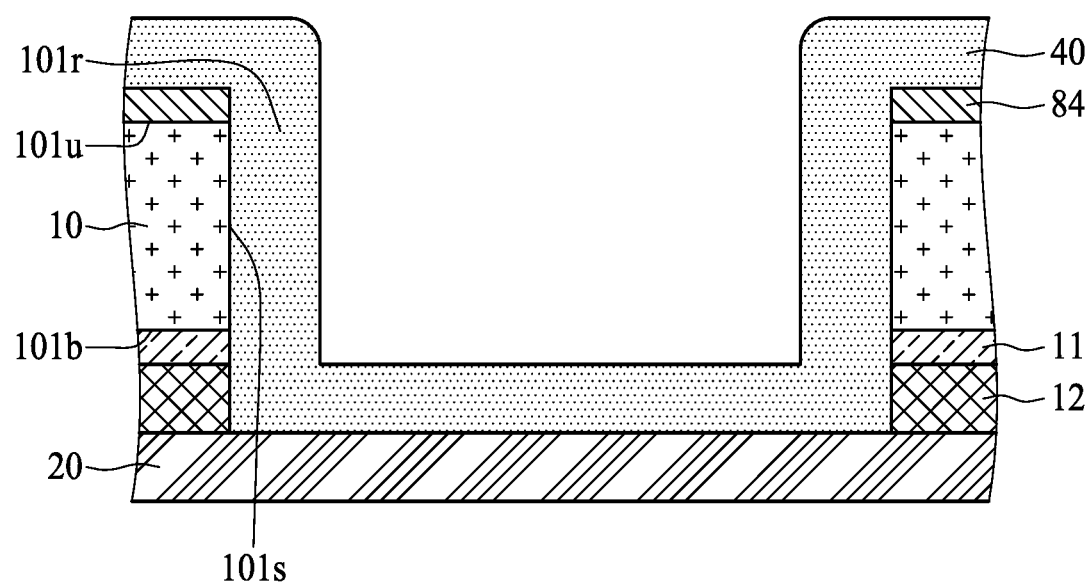

Referring to FIG. 2G, an insulation layer 40 is disposed to cover the surface of the stress adjusting layer 84 and the active circuit layer 20. The insulation layer 40 also covers at least a portion of a sidewall 101s of the recess 101r. In one or more embodiments, a material of the insulation layer 40 may include, for example, a solder mask, a PP, a PI, an ABF, an epoxy, a molding compound, a liquid type (or solid type) photosensitive material, a glass, a ceramic, or other suitable conductive materials.

Figure 2H:
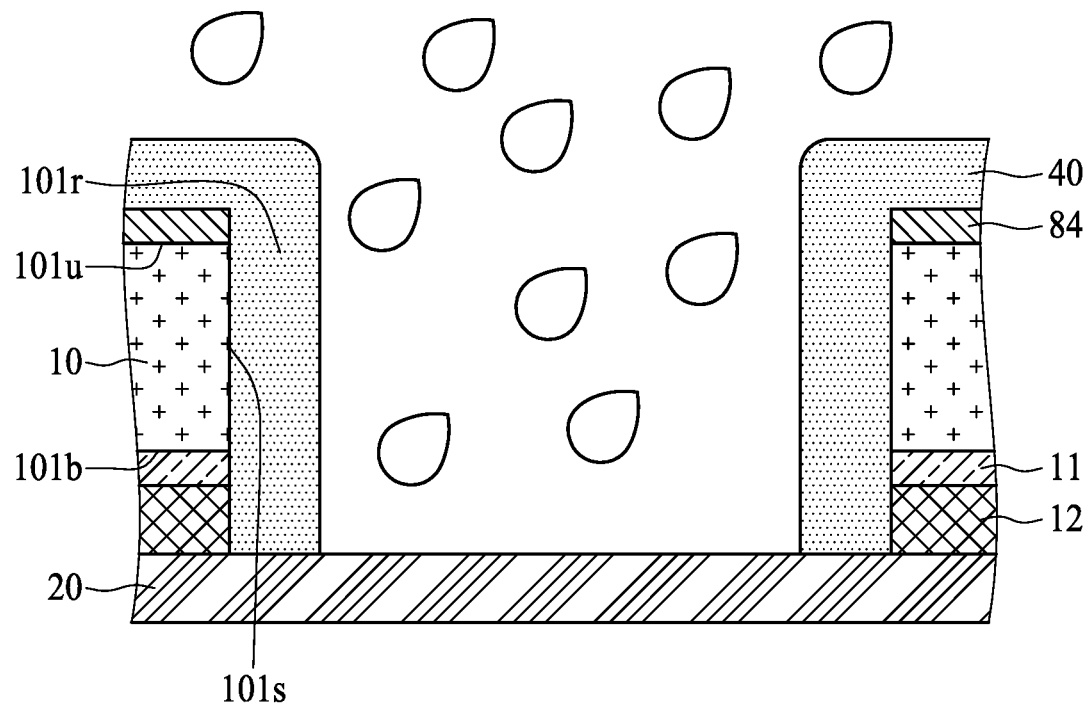

Referring to FIG. 2H, a portion of the insulation layer 40 is etched using a suitable gas. After the etching operation, a portion of the surface of the active circuit layer 20 is exposed.

Figure 2I:
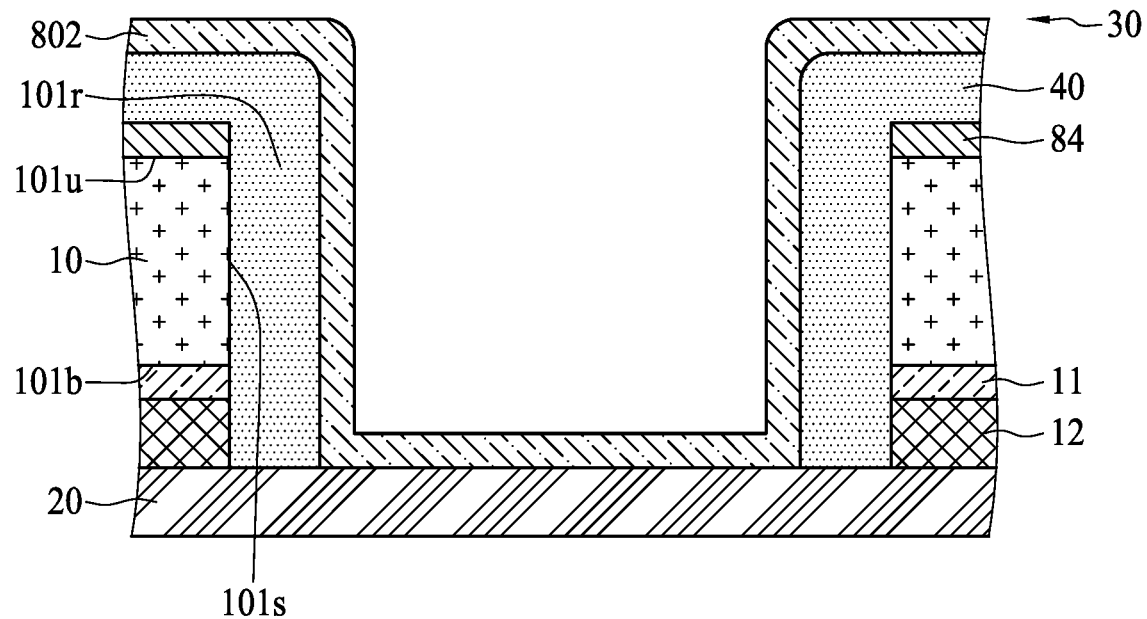

Referring to FIG. 2I, a seed layer 802 is formed on the insulation layer 40 and the exposed surface of the active circuit layer 20. The seed layer 802 may be formed by using one or more physical vapor deposition (PVD) techniques. In one or more embodiments, a material of the seed layer 802 may include, for example, Cu, a titanium (Ti) copper alloy (Ti/Cu), another metal, another alloy, or other suitable conductive materials.

Figure 2J:
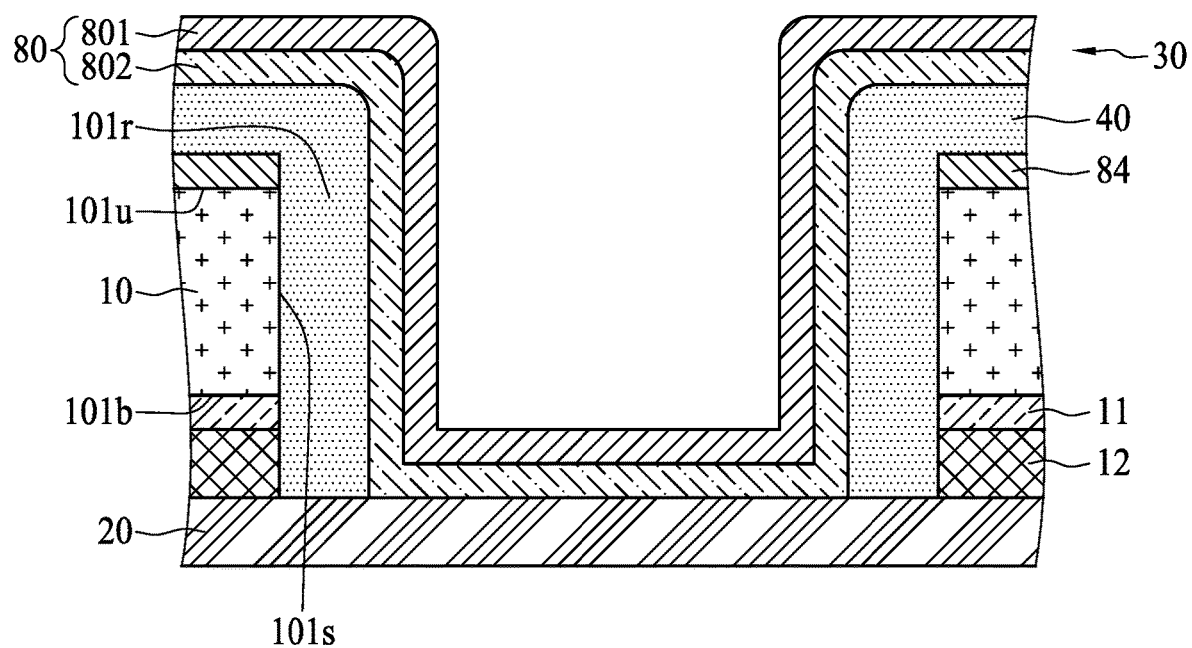

Referring to FIG. 2J, a layer 801 is disposed on the seed layer 802 by plating. In one or more embodiments, a material of the layer 801 may include, for example, Cu, another metal, an alloy, or other suitable conductive materials.

Figure 2K:
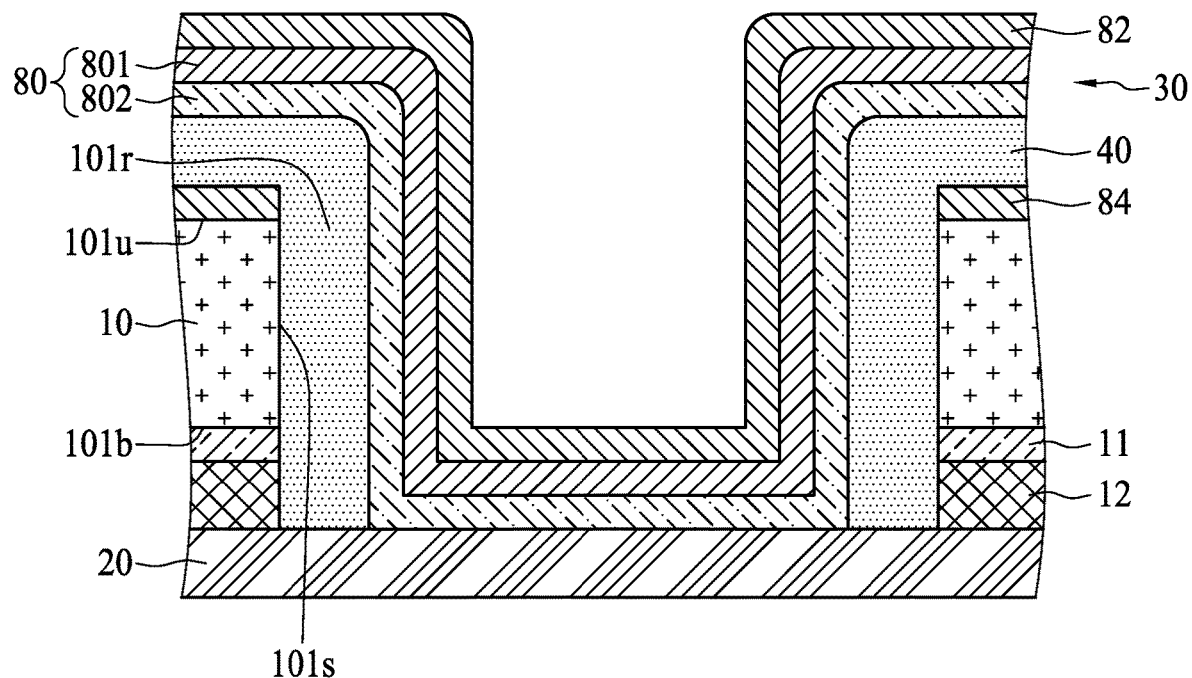

Referring to FIG. 2K, a conductive layer 82 having a negative CTE is formed on the layer 801. In one or more embodiments, a material of the conductive layer 82 may include, for example, graphene, or other suitable conductive materials.

Figure 2L:
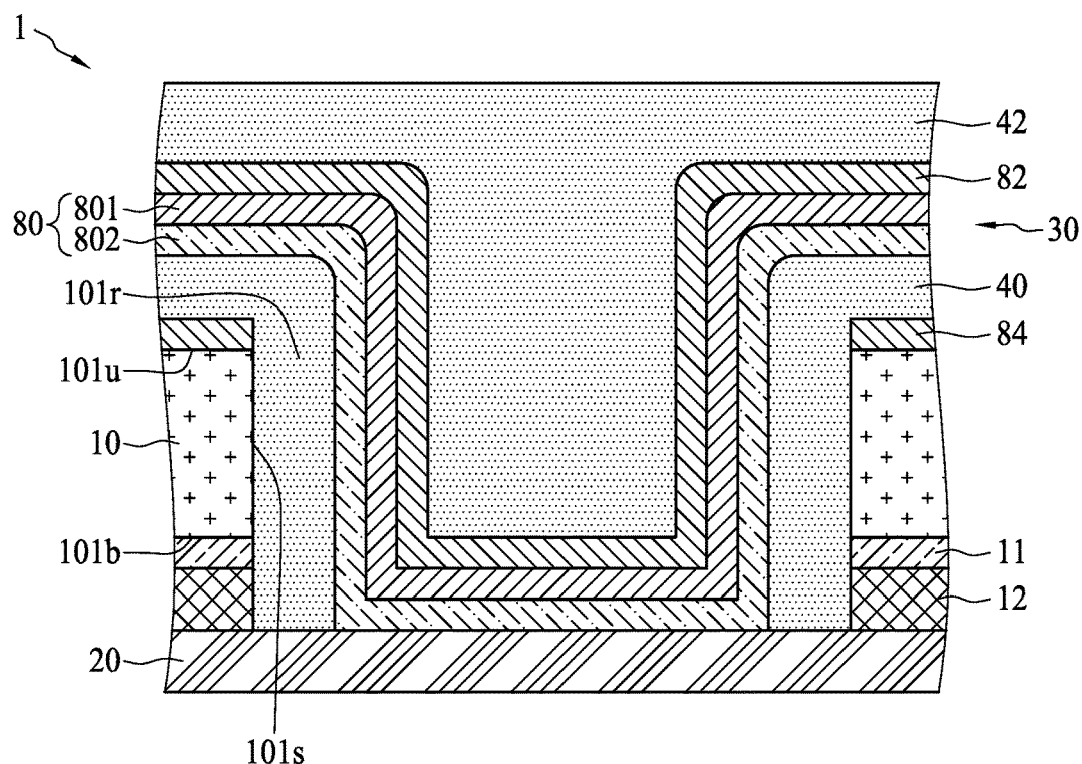

Referring to FIG. 2L, an insulation layer 42 is disposed on the conductive layer 82. In one or more embodiments, a material of the insulation layer 42 may include, for example, a solder mask, PP, a PI, an ABF, an epoxy, a molding compound, a liquid type (or solid type) photosensitive material, a glass, a ceramic, or other suitable conductive materials. The CTE of the insulation layer 42 is greater than 0 (is positive). The conductive layer 82 with a negative CTE (including, for example, graphene) may contract as the temperature is increasing during a heating operation. The contraction of the conductive layer 82 with a negative CTE may compensate, at least in part, for a thermal expansion of the insulation layer 40 during the heating operation. The expansion of the conductive layer 82 with a negative CTE may compensate, at least in part, for the contraction of the insulation layer 40 during a cooling operation. The compensation during the heating operation and the cooling operation may avoid micro-cracking or delamination effects of the electrical device 1. After the disposing of the insulation layer 42, the electrical device 1 of FIG. 1 is obtained.

Figure 3A:
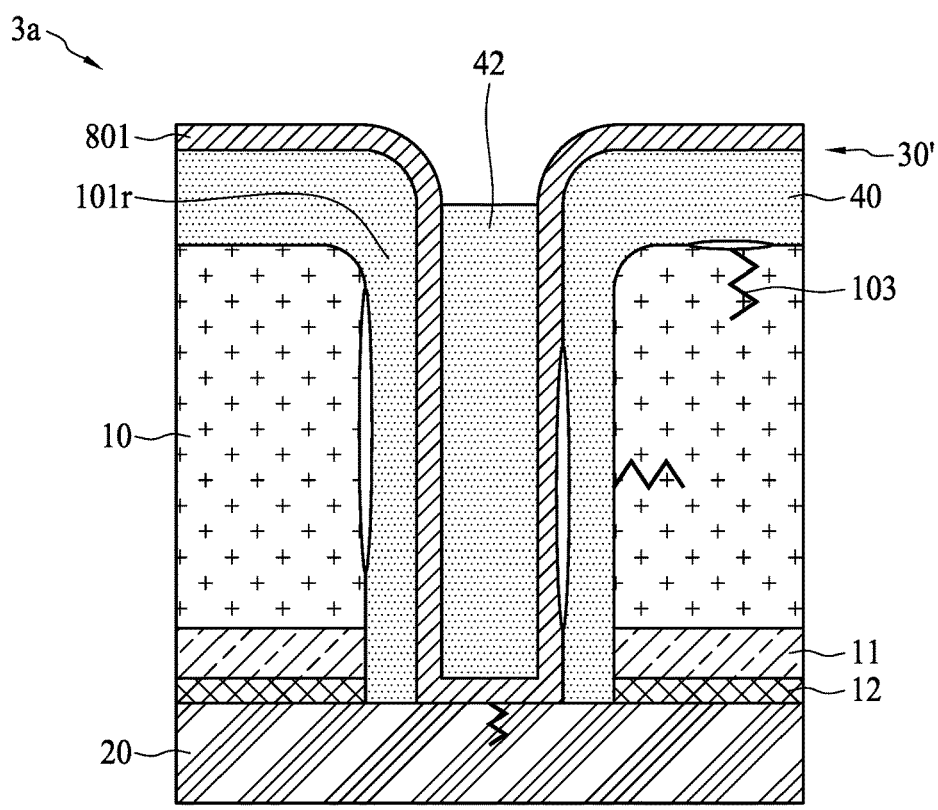
FIG. 3A is a cross-sectional view of an electrical device in accordance with a comparative example.

FIG. 3A is a cross-sectional view of an electrical device 3a according to a comparative example. The electrical device 3a is similar to the electrical device 1 of FIG. 1 in certain respects, and certain details of same-numbered components are not described again with respect to FIG. 3A. The electrical device 3a includes a substrate 10, a dielectric layer 11, a conductive layer 12, an active circuit layer 20 and a via 30'. The substrate 10 has a surface 101u and defines a recess 101r in the surface 101u. The via 30' includes an insulation layer 40, an insulation layer 42 and a conductive layer 801. The insulation layer 40 disposed in the recess 101r may stress the substrate 10 or the conductive layer 801 due to thermal expansion during a heating operation. The stress may cause delamination effects or micro-cracks 103 in the substrate 10.

Figure 3B:
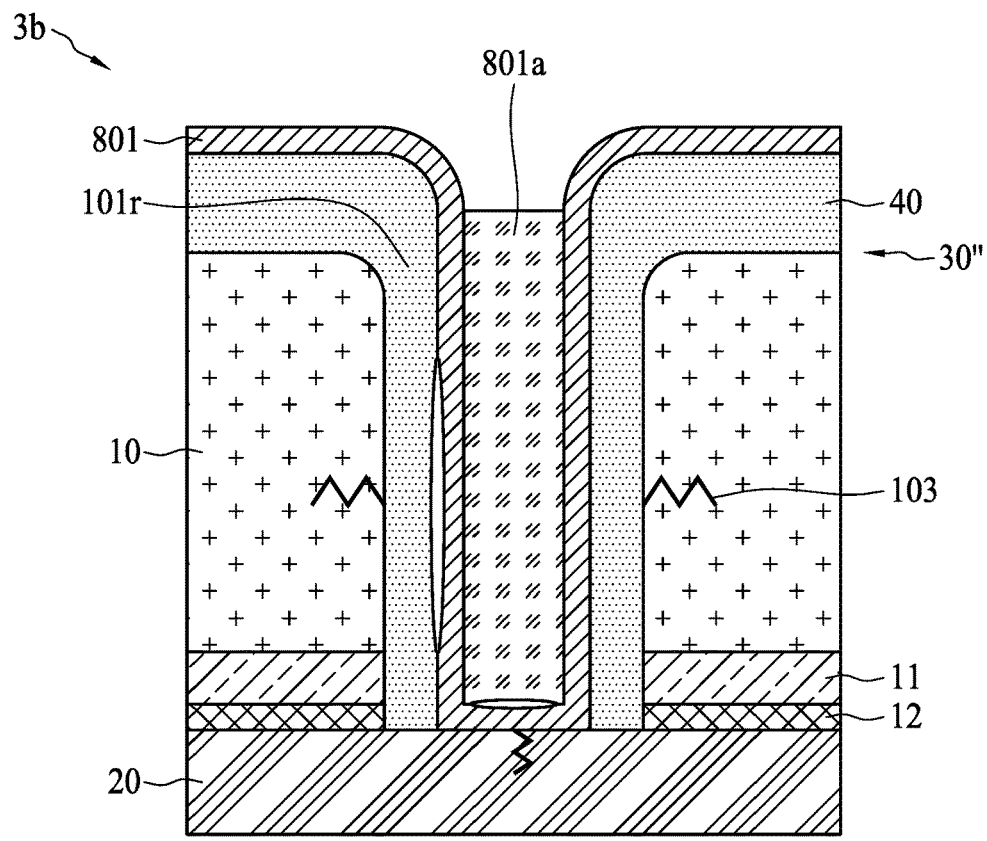
FIG. 3B is a cross-sectional view of an electrical device in accordance with a comparative example.

FIG. 3B is a cross-sectional view of an electrical device 3b according to a comparative example. The electrical device 3b is similar to the electrical device 1 of FIG. 1 in certain respects, and certain details of same-numbered components are not described again with respect to FIG. 3B. The electrical device 3b includes a substrate 10, a dielectric layer 11, a conductive layer 12, an active circuit layer 20 and a via 30". The substrate 10 has a surface 101u and defines a recess 101r in the surface 101u. The via 30" includes an insulation layer 40, a conductive layer 801a and a conductive layer 801. The insulation layer 40 disposed in the recess 101r may stress the substrate 10 or the conductive layer 801 due to thermal expansion during a heating operation. The stress may cause delamination effects or micro-cracks 103 in the substrate 10. The conductive layer 801a may stress the conductive layer 801 and cause the micro-cracks 103 of the substrate 10.

Figure 4A:
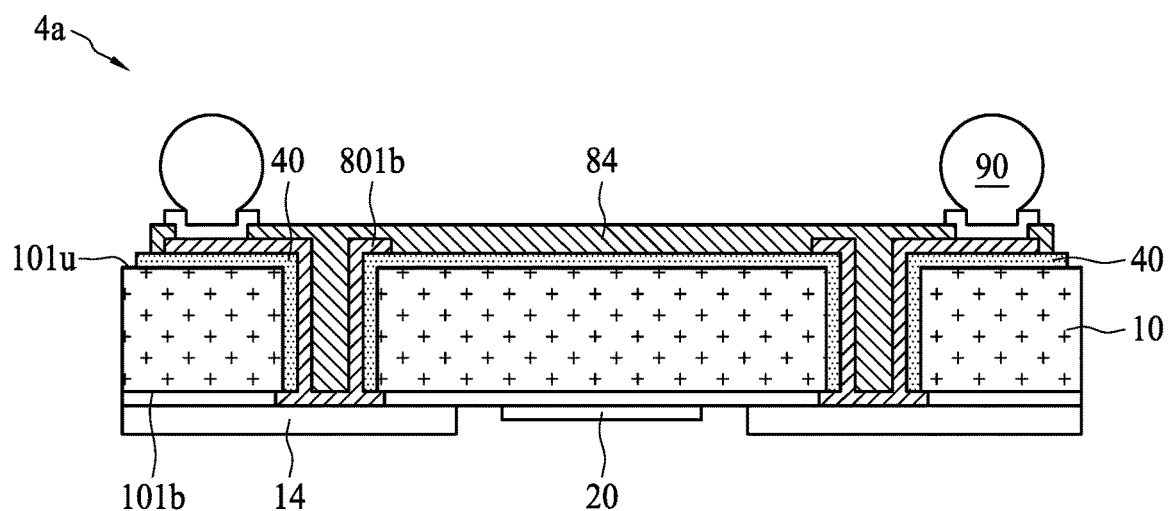
FIG. 4A is a cross-sectional view of an electrical device in accordance with some embodiments of the present disclosure.

FIG. 4A is a cross-sectional view of an electrical device 4a in accordance with some embodiments of the present disclosure. A portion of the electrical device 4a is similar to the electrical device 1 of FIG. 1, and certain details of same-numbered components are not described again with respect to FIG. 4A. The electrical device 4a includes a substrate 10, a protection layer 14, an insulation layer 40, a stress adjusting layer 84, a conductive layer 801b, an active circuit layer 20 and solders 90 (e.g. solder bumps). The substrate 10 has a surface 101u and a surface 101b opposite to the surface 101u. The stress adjusting layer 84 is disposed on the insulation layer 40 and the conductive layer 801b. The conductive layer 801b defines an opening. A portion of the stress adjusting layer 84 is disposed within the opening of the conductive layer 801b. Contraction of the stress adjusting layer 84 may constrain or at least partially cancel out stress caused by thermal expansion of the insulation layer 40 during a heating operation. The contraction of the stress adjusting layer 84 may help to avoid the warpage of the substrate 10 of the electrical device 4a.

Figure 4B:
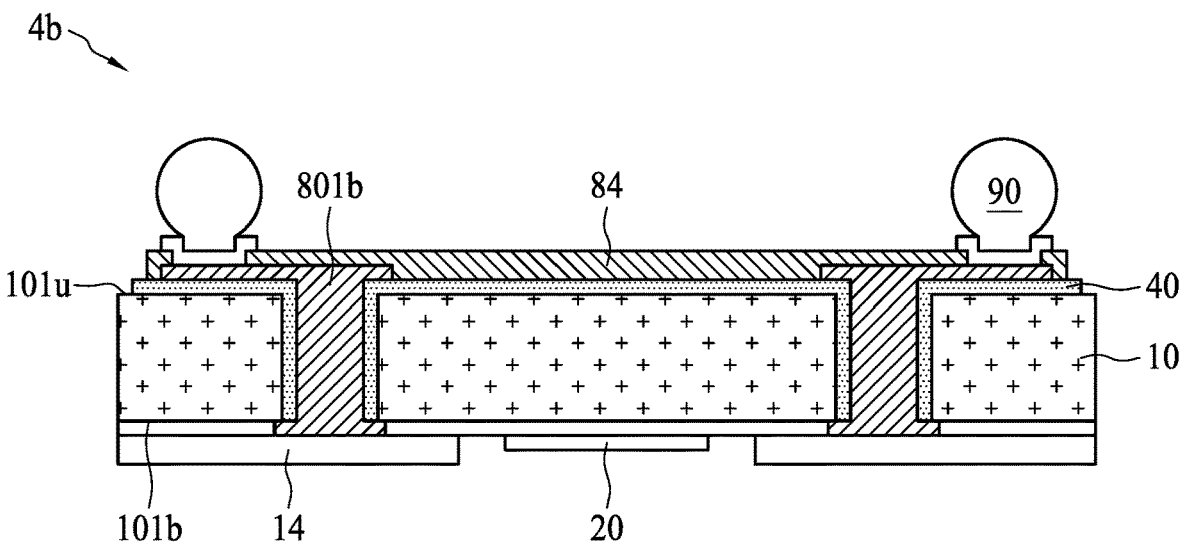
FIG. 4B is a cross-sectional view of an electrical device in accordance with some embodiments of the present disclosure.

FIG. 4B is a cross-sectional view of an electrical device 4b in accordance with some embodiments of the present disclosure. A portion of the electrical device 4b is similar to the electrical device 1 of FIG. 1, and certain details of same-numbered components are not described again with respect to FIG. 4B. The electrical device 4b includes a substrate 10, a protection layer 14, an insulation layer 40, a stress adjusting layer 84, a conductive layer 801b, an active circuit layer 20 and solders 90. The substrate 10 has a surface 101u and a surface 101b opposite to the surface 101u. The stress adjusting layer 84 is disposed on the insulation layer 40 and conductive layer 801b. The contraction of the stress adjusting layer 84 having a negative CTE may constrain or at least partially cancel out the stress caused by the thermal expansion of the insulation layer 40 having a positive CTE during a heating operation. The contraction of the stress adjusting layer 84 may help to avoid the warpage of the substrate 10 of the electrical device 4b.

Figure 5:
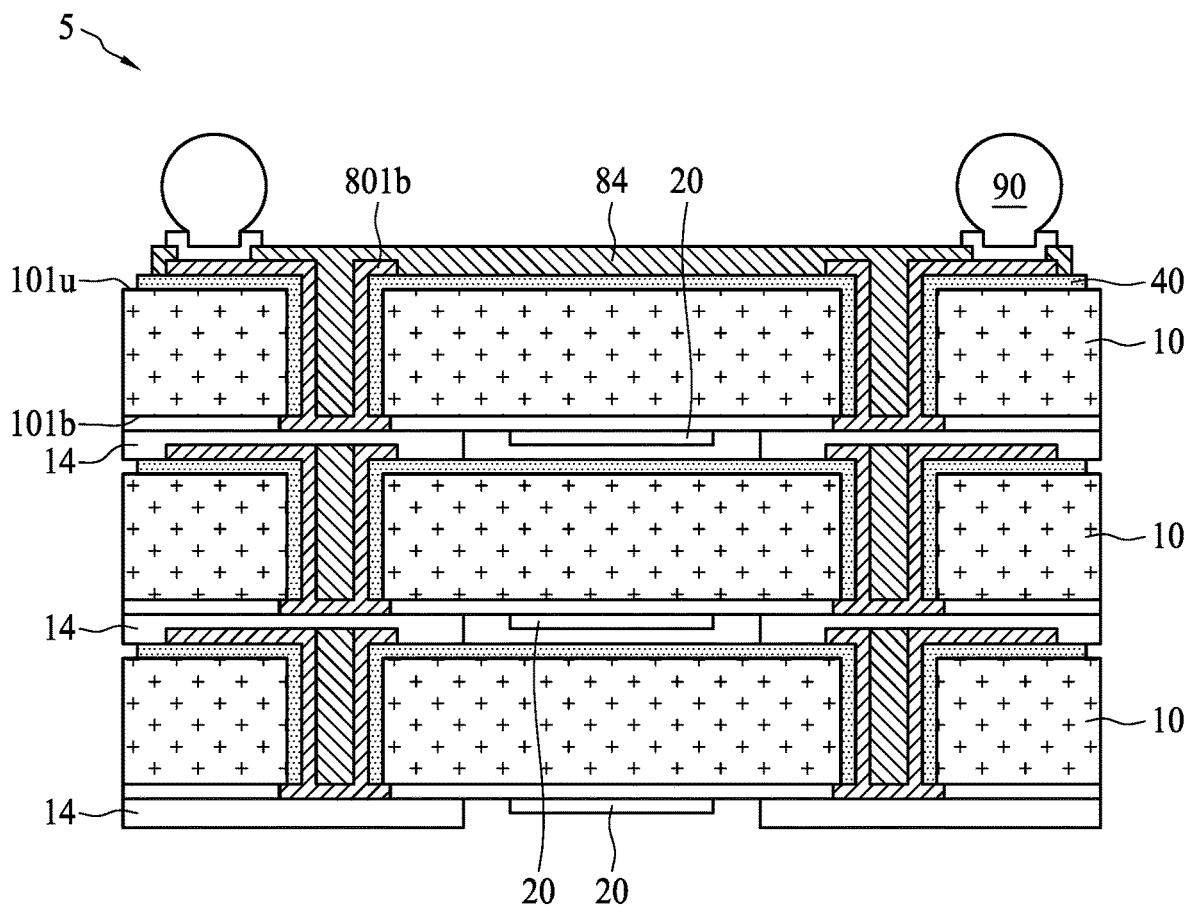
FIG. 5 is a cross-sectional view of an electrical device in accordance with some embodiments of the present disclosure.

FIG. 5 is a cross-sectional view of an electrical device 5 in accordance with some embodiments of the present disclosure. A portion of the electrical device 5 is similar to the electrical device 1 of FIG. 1, and certain details of same-numbered components are not described again with respect to FIG. 5. The electrical device 5 includes a plurality of substrates 10, a plurality of protection layers 14, a plurality of insulation layers 40, a plurality of stress adjusting layers 84, a plurality of conductive layers 801b, a plurality of active circuit layers 20 and solders 90. The substrates 10 each have a surface 101u and a surface 101b opposite to the surface 101u. A top stress adjusting layer 84 of the plurality of stress adjusting layers 84 is disposed on the insulation layer 40 and conductive layer 801b. Contraction of the top stress adjusting layer 84 having a negative CTE may constrain or at least partially cancel out the stress caused the thermal expansion of the insulation layer 40 having a positive CTE during a heating operation. A top conductive layer 801b of the plurality of conductive layers 801b defines an opening. The top stress adjusting layer 84 may be disposed in the opening of the top conductive layer 801b and may compensate for a CTE mismatch between the components in the electrical device 5. The other stress adjusting layers 84 of the plurality of stress adjusting layers 84 may perform a similar stress mitigation function.

Figure 6A:
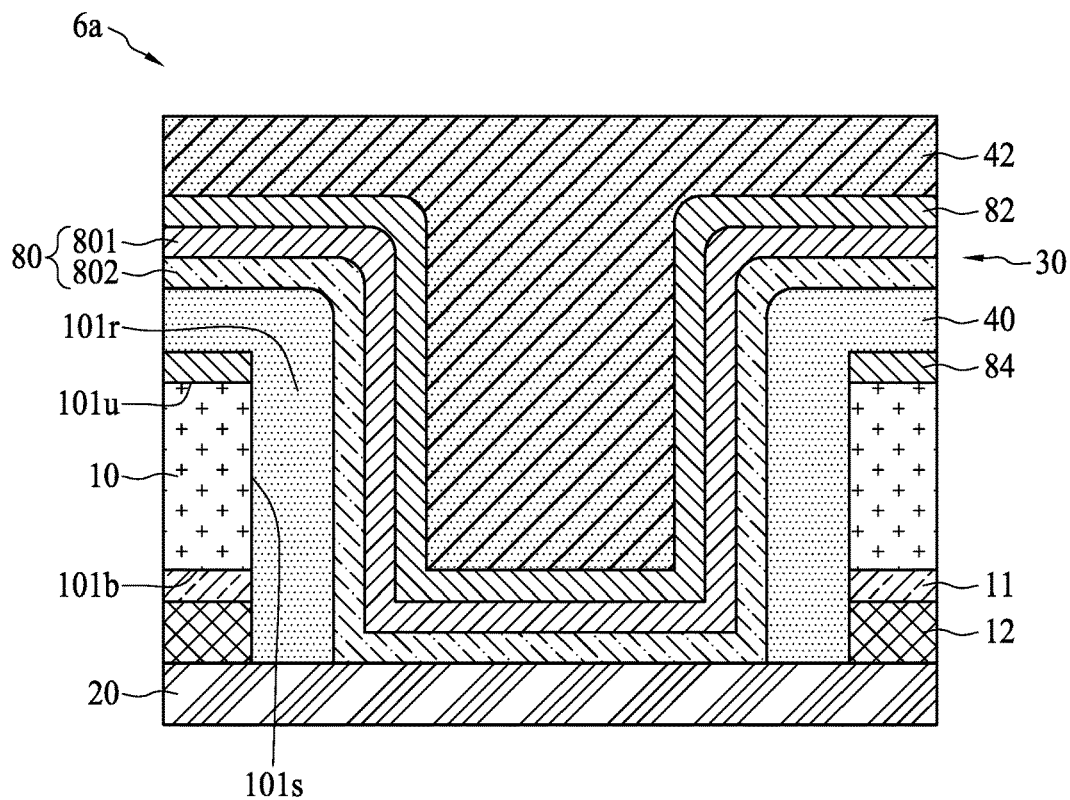
FIG. 6A is a cross-sectional view of an electrical device in accordance with some embodiments of the present disclosure.

FIG. 6A is a cross-sectional view of an electrical device 6a in accordance with some embodiments of the present disclosure. The electrical device 6a is similar to the electrical device 1 of FIG. 1, and certain details of same-numbered components are not described again with respect to FIG. 6A. The electrical device 6a includes a substrate 10, a stress adjusting layer 84, a dielectric layer 11, a conductive layer 12, an active circuit layer 20 and a via 30. In some embodiments, the insulation layer 42 is different from the insulation layer 40. In one or more embodiments, a material of the insulation layer 40 may include a solid type material, or other suitable conductive materials. In one or more embodiments, a material of the insulation layer 42 may be liquid type material, or other suitable conductive materials.

Figure 6B:
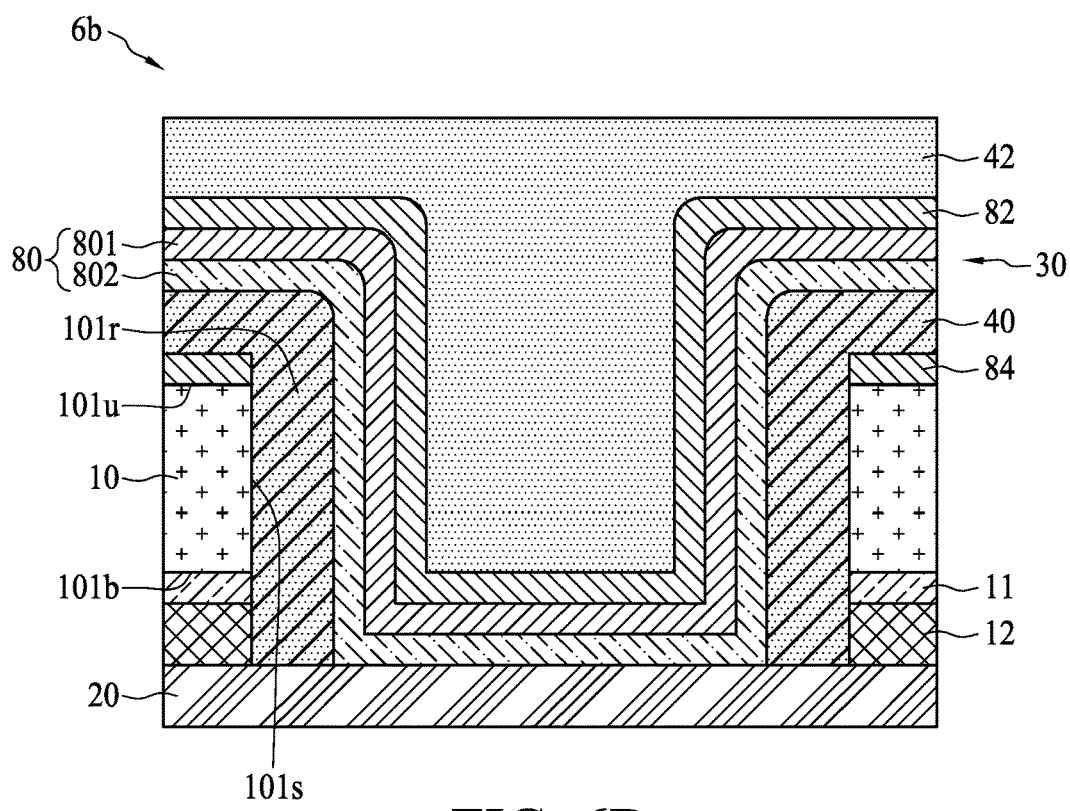
FIG. 6B is a cross-sectional view of an electrical device in accordance with some embodiments of the present disclosure.

FIG. 6B is a cross-sectional view of an electrical device 6b in accordance with some embodiments of the present disclosure. The electrical device 6b is similar to the electrical device 1 of FIG. 1, and certain details of same-numbered components are not described again with respect to FIG. 6B. The electrical device 6a includes a substrate 10, a stress adjusting layer 84, a dielectric layer 11, a conductive layer 12, an active circuit layer 20 and a via 30. In some embodiments, the insulation layer 42 is different from the insulation layer 40. In one or more embodiments, a material of the insulation layer 42 may include solid type material, or other suitable conductive materials. In one or more embodiments, a material of the insulation layer 40 may include a liquid type material, or other suitable conductive materials.

Figure 7A:
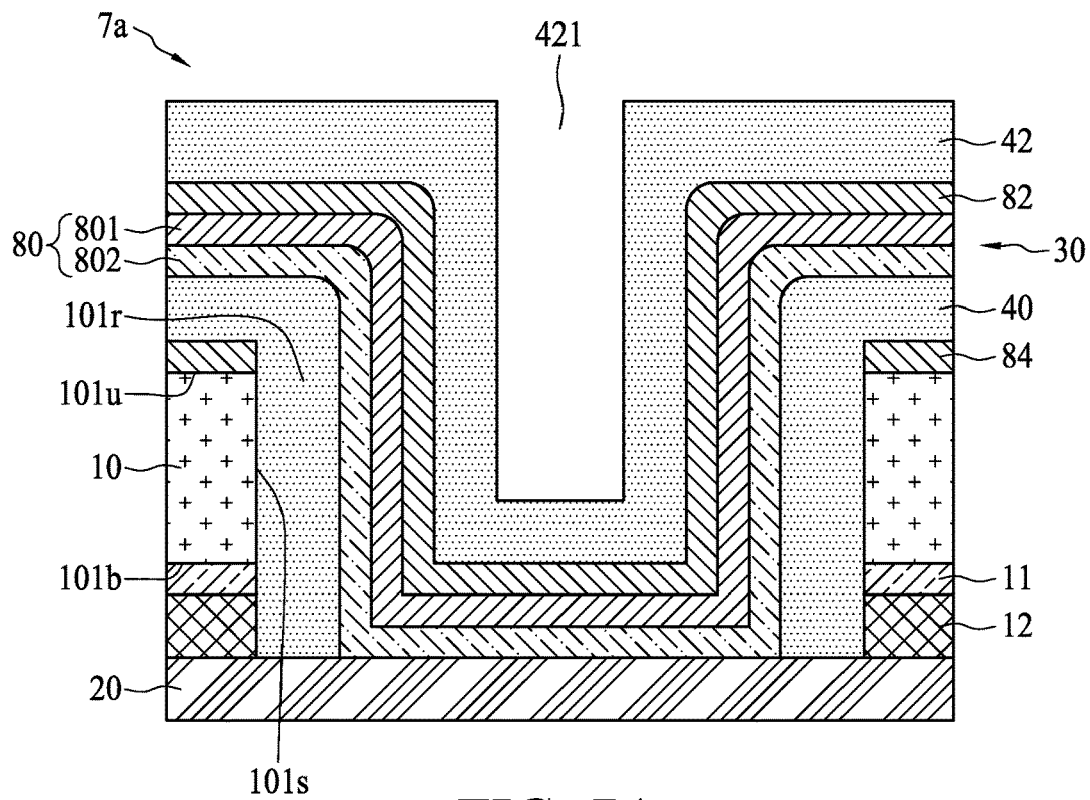
FIG. 7A is a cross-sectional view of an electrical device in accordance with some embodiments of the present disclosure.

FIG. 7A is a cross-sectional view of an electrical device 7a in accordance with some embodiments of the present disclosure. The electrical device 7a is similar to the electrical device 1 of FIG. 1, and certain details of same-numbered components are not described again with respect to FIG. 7A. The electrical device 7a includes a substrate 10, a stress adjusting layer 84, a dielectric layer 11, a conductive layer 12, an active circuit layer 20 and a via 30. In one or more embodiments, the insulation layer 42 defines a recess 421. The recess 421 is not filled with solid materials (e.g. is substantially empty). The recess 421 may provide a space to compensate for thermal expansion of the insulation layer 42.

Figure 7B:
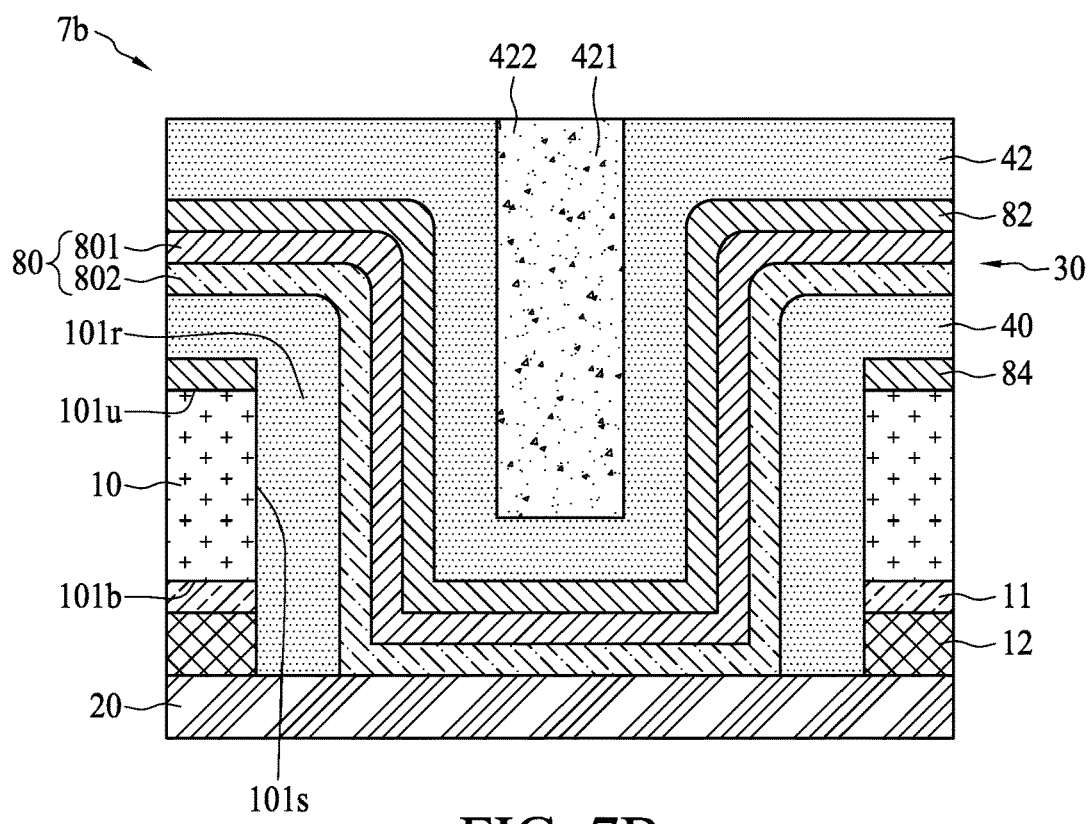
FIG. 7B is a cross-sectional view of an electrical device in accordance with some embodiments of the present disclosure.

FIG. 7B is a cross-sectional view of an electrical device 7b in accordance with some embodiments of the present disclosure. The electrical device 7b is similar to the electrical device 1 of FIG. 1, and certain details of same-numbered components are not described again with respect to FIG. 7B. The electrical device 7b includes a substrate 10, a stress adjusting layer 84, a dielectric layer 11, a conductive layer 12, an active circuit layer 20 and a via 30. In one or more embodiments, the insulation layer 42 defines a recess 421. The recess 421 is filled with a material 422, such as, a solder mask, PP, a PI, an ABF, an epoxy, a molding compound, a photosensitive material, a glass, a ceramic, a liquid type or solid type suitable material.

Figure 8:
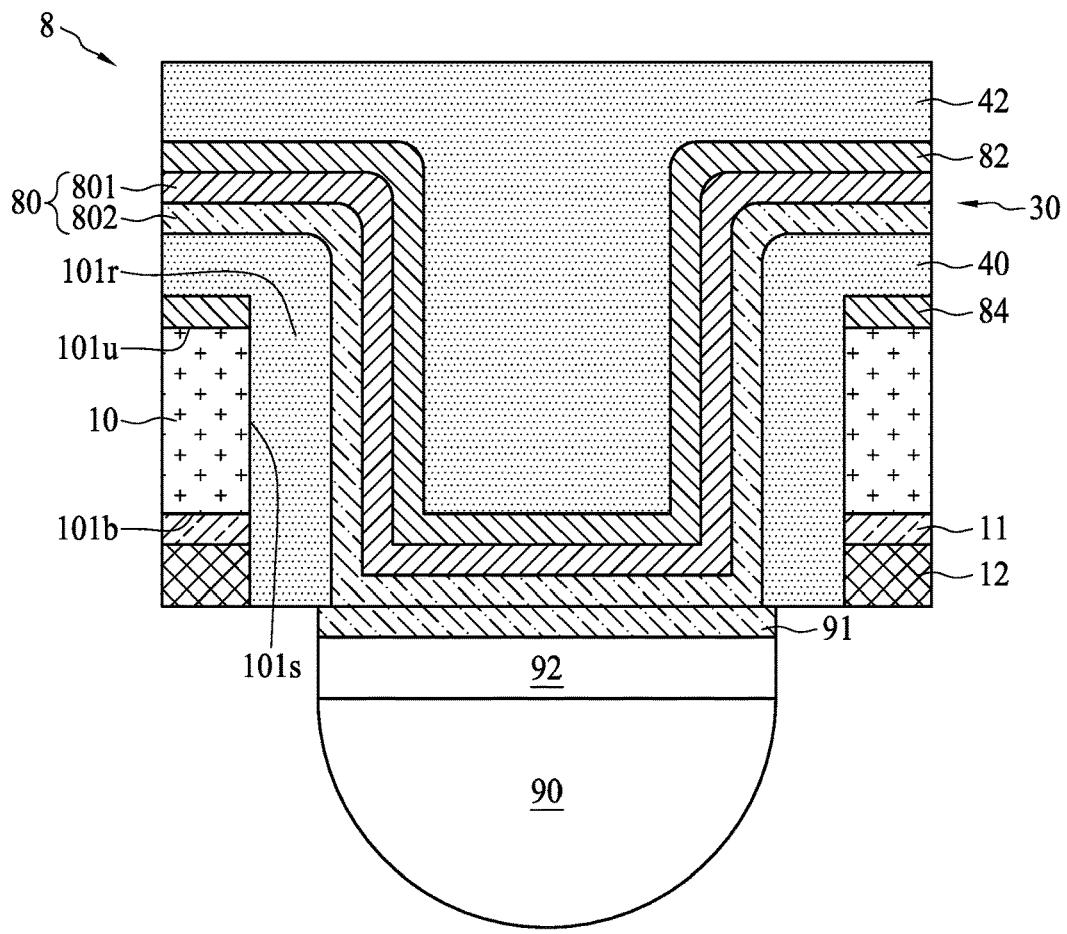
FIG. 8 is a cross-sectional view of an electrical device in accordance with some embodiments of the present disclosure.

FIG. 8 is a cross-sectional view of an electrical device 8 in accordance with some embodiments of the present disclosure. The electrical device 8 is similar to the electrical device 1 of FIG. 1, and certain details of same-numbered components are not described again with respect to FIG. 8. The electrical device 8 includes a substrate 10, a stress adjusting layer 84, a dielectric layer 11, a conductive layer 12, a via 30, a layer 91, pad 92 and solder 90 (e.g. a solder bump). The electrical device 8 omits an active circuit layer 20. The layer 91 may be a conductive layer. The layer 91 is disposed below the seed layer 802. In one or more embodiments, the layer 91 may include a seed layer. In one or more embodiments, a material of the layer 91 and pad 92 may include, for example, Cu, another conductive metal or alloy, or other suitable conductive materials.

Figure 9:
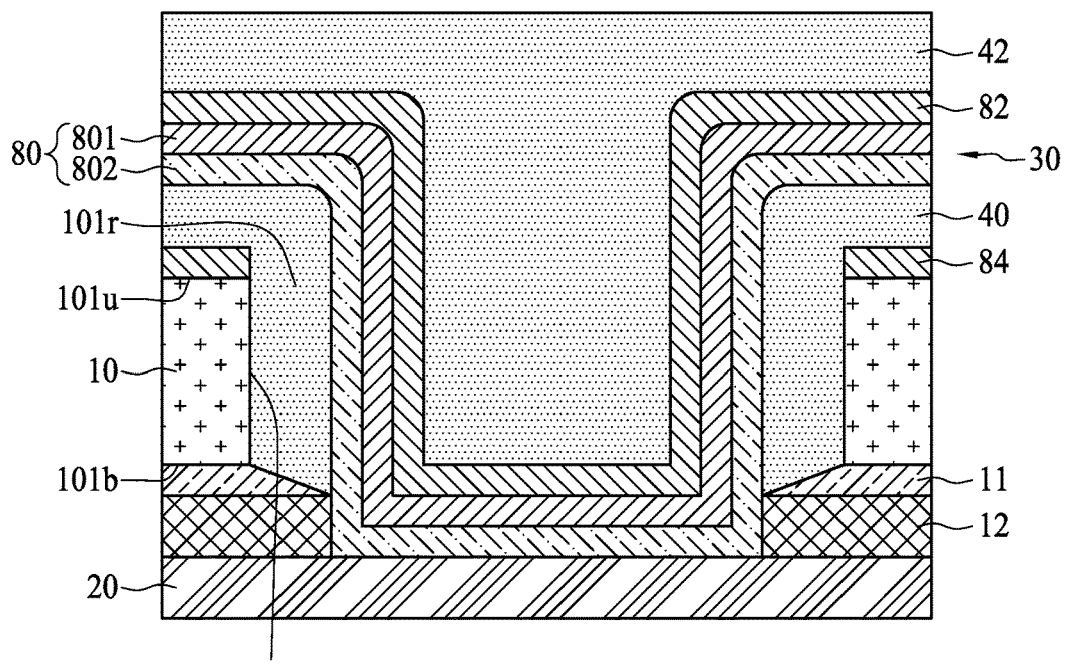
FIG. 9 is a cross-sectional view of an electrical device in accordance with some embodiments of the present disclosure.

FIG. 9 is a cross-sectional view of an electrical device 9 in accordance with some embodiments of the present disclosure. The electrical device 9 is similar to the electrical device 1 of FIG. 1, and certain details of same-numbered components are not described again with respect to FIG. 9. The electrical device 9 includes a substrate 10, a stress adjusting layer 84, a dielectric layer 11, a conductive layer 12, an active circuit layer 20 and a via 30. In one or more embodiments, the dielectric layer 11 may extend at least to the bottom of the insulation layer 40, and may be disposed on the insulation layer 40. The thickness of the dielectric layer 11 may gradually decrease or taper along the insulation layer 40 due to the operation for etching dielectric layer 11. The conductive layer 12 is separated from the insulation layer 40 by the dielectric layer 11.

Figure 10A:
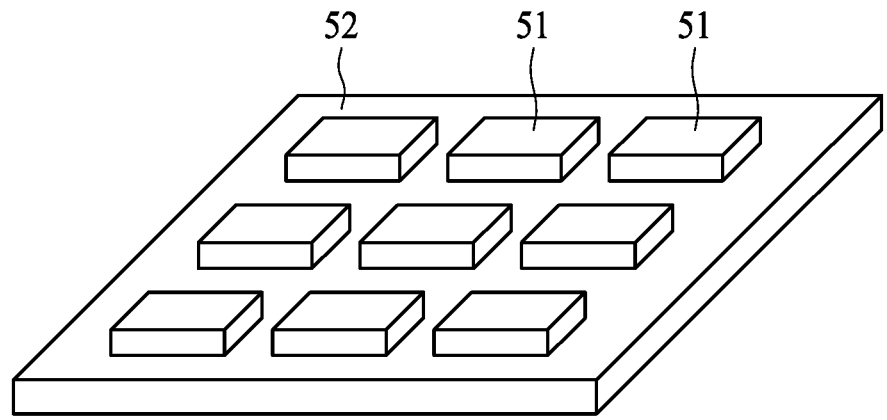
FIG. 10A and FIG. 10B illustrate different types of semiconductor package devices in accordance with some embodiments of the present disclosure.
Figure 10B:
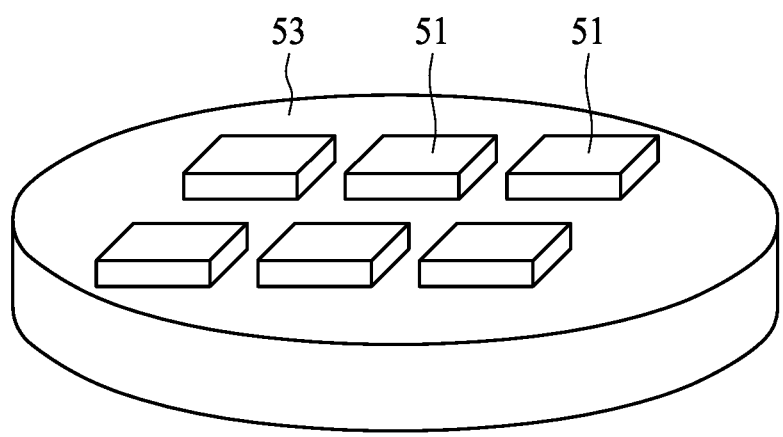

FIG. 10A and FIG. 10B illustrate different types of semiconductor package devices in accordance with some embodiments of the present disclosure.

As shown in FIG. 10A, a plurality of chips 51 or dies are placed on a substantially square-shaped carrier 52 (e.g. in accordance with one or more embodiments described herein). In some embodiments, the carrier 52 may include organic materials (e.g., a molding compound, bismaleimide triazine (BT), a PI, polybenzoxazole (PBO), a solder resist, an ABF, PP or an epoxy-based material) and/or inorganic materials (e.g., silicon, a glass, a ceramic, or quartz).

As shown in FIG. 10B, a plurality of chips 51 or dies are placed on a substantially circle-shaped carrier 53 (e.g. in accordance with one or more embodiments described herein). In some embodiments, the carrier 53 may include organic materials (e.g., a molding compound, BT, a PI, PBO, a solder resist, an ABF, PP or an epoxy-based material) and/or inorganic materials (e.g., silicon, a glass, a ceramic, or quartz).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Thus, the term "approximately equal" in reference to two values can refer to a ratio of the two values being within a range between and inclusive of 0.9 and 1.1.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

Two surfaces or sides can be deemed to be aligned if a displacement between the two surfaces is no greater than 0.5 µm, no greater than 1 µm, no greater than 5 µm, no greater than 10 µm, or no greater than 15 µm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electrical device, comprising:
    a substrate having a first surface and defining a recess in the first surface;
    an active circuit layer; and
    a via disposed in the recess, the via comprising:
        an insulation layer disposed on the first surface of the substrate and extending at least to a sidewall of the recess;
        a first conductive layer disposed adjacent to the insulation layer and extending over at least a portion of the first surface of the substrate, the first conductive layer being in direct contact with the active circuit layer;
        a second conductive layer disposed adjacent to the first conductive layer and extending over at least a portion of the first surface of the substrate, the second conductive layer having a negative coefficient of thermal expansion (CTE); and
    a stress adjusting layer disposed on and in contact with the first surface of the substrate, and wherein a CTE of the stress adjusting layer is negative.

2. The electrical device according to claim 1, wherein the substrate has a second surface opposite to the first surface and the active circuit layer is disposed on the second surface.

3. The electrical device according to claim 2, wherein the active circuit layer is electrically connected to the first conductive layer.

4. The electrical device according to claim 1, wherein the second conductive layer and the stress adjusting layer comprise a same material.

5. The electrical device according to claim 4, wherein the second conductive layer comprises graphene.

6. The electrical device according to claim 5, wherein the first conductive layer comprises copper (Cu).

7. The electrical device according to claim 1, wherein the substrate comprises a semiconductor material.

8. An electrical device, comprising:
    a substrate having a first surface that defines at least a portion of a recess, and a second surface opposite to the first surface;
    an active circuit layer disposed on the second surface of the substrate; and
    a via disposed in the recess, the via comprising:
        a first insulation layer disposed adjacent to a sidewall of the recess;
        a first conductive layer disposed adjacent to the first insulation layer, wherein a coefficient of thermal expansion (CTE) of the first conductive layer is positive, and the first conductive layer is in direct contact with the active circuit layer;
        a second conductive layer disposed adjacent to the first conductive layer, and wherein a CTE of the second conductive layer is negative,
        a second insulation layer disposed adjacent to the second conductive layer, wherein a CTE of the second insulation layer is positive and wherein the second conductive layer surrounds the second insulation layer; and
    a stress adjusting layer disposed on and in contact with the first surface of the substrate, and wherein a CTE of the stress adjusting layer is negative.

9. The electrical device according to claim 8, wherein the active circuit layer is electrically connected to the first conductive layer.

10. The electrical device according to claim 8, wherein the second conductive layer and the stress adjusting layer comprise a same material.

11. The electrical device according to claim 10, wherein the second conductive layer comprises graphene.

12. The electrical device according to claim 11, wherein the first conductive layer comprises Cu.

13. The electrical device according to claim 8, wherein the substrate comprises a semiconductor material.

14. An electrical device, comprising:
a substrate having a first surface that defines at least a portion of a recess, and a second surface opposite to the first surface;
an active circuit layer disposed on the second surface; and
a via disposed in the recess, the via comprising:
an insulation ring disposed on the first surface and adjacent to a sidewall of the recess;
a first conductive cup disposed in the insulation ring, the first conductive cup being in direct contact with the active circuit layer;
a second conductive cup disposed in the first conductive cup, wherein a coefficient of thermal expansion (CTE) of the second conductive cup is negative; and
an insulation layer disposed in the second conductive cup; and
a stress adjusting layer disposed on and in contact with the first surface of the substrate, and wherein a CTE of the stress adjusting layer is negative.

15. The electrical device according to claim 14, wherein a CTE of the insulation layer is positive, and a CTE of the first conductive cup is positive.

16. The electrical device according to claim 14, wherein the second conductive cup extends over at least a portion of the first surface of the substrate.

17. The electrical device according to claim 14, wherein the second conductive cup and the stress adjusting layer comprise a same material.

18. The electrical device according to claim 17, wherein the second conductive cup comprises graphene.

19. The electrical device according to claim 18, wherein the first conductive cup comprises Cu.

20. The electrical device according to claim 14, wherein the substrate comprises a semiconductor material.

21. An electrical device, comprising:
a substrate having a first surface and defining a through hole having a sidewall;
an active circuit layer;
a via disposed in the through hole and comprising:
an insulation ring disposed on the first surface of the substrate and adjacent to the sidewall of the through hole; and
one or more conductive portions including a first conductive cup disposed in the insulation ring, the first conductive cup being in direct contact with the active circuit layer; and
a patterned conductive layer having a negative coefficient of thermal expansion (CTE) disposed on the first surface of the substrate,
wherein the patterned conductive layer is electrically insulated from the conductive portions of the via.

* * * * *